United States Patent [19]

Sakakibara et al.

[11] Patent Number: 4,767,959
[45] Date of Patent: Aug. 30, 1988

[54] METHOD AND APPARATUS FOR DRIVING CAPACITIVE-TYPE LOAD

[75] Inventors: Yasuyuki Sakakibara, Nishio; Toshihiko Igashira, Toyokawa; Kiyonori Sekiguchi; Masahiro Takigawa, both of Nukata; Yoshimi Natsume, Toyokawa, all of Japan

[73] Assignees: Nippondenso Co., Ltd., Kariya; Nippon Soken, Inc., Nishio, both of Japan

[21] Appl. No.: 94,738

[22] Filed: Sep. 9, 1987

[30] Foreign Application Priority Data

Sep. 17, 1986 [JP] Japan .................. 61-217309

[51] Int. Cl.[4] ........................................... H01L 41/08
[52] U.S. Cl. ...................................... 310/317; 310/316; 310/328; 123/478; 123/498
[58] Field of Search ............... 310/316, 317, 318, 319, 310/323, 328; 318/116, 118; 239/584, 585; 123/498, 490, 446, 478

[56] References Cited

U.S. PATENT DOCUMENTS

| 3,800,170 | 3/1974 | Kline et al. ........................ 310/317 |
| 4,126,867 | 11/1978 | Stevenson, Jr. ................ 310/317 X |
| 4,398,204 | 8/1983 | Dietrich et al. ................ 310/317 X |
| 4,570,098 | 2/1986 | Tomita et al. ................... 310/328 X |
| 4,593,658 | 6/1986 | Moloney ......................... 310/316 X |
| 4,644,212 | 2/1987 | Moritugu et al. .............. 310/316 X |
| 4,705,003 | 11/1987 | Sakakibara et al. ............ 310/317 X |

FOREIGN PATENT DOCUMENTS 0064077  4/1983  Japan .................................. 310/317

Primary Examiner—Mark O. Budd
Attorney, Agent, or Firm—Cushman, Darby & Cushman

[57] ABSTRACT

A method and apparatus for driving a capacitive-type load using a direct current power source, a charging circuit connected in series to the load, a discharging circuit connected in parallel to the load, and an electric circuit for controlling the charging and discharging circuits, and wherein at least one of the charging and discharging circuits has a primary coil, and a secondary coil coupled to the primary coil restores energy, generated when the charging or discharging is turned OFF, to the power source. This provides a highly efficient driving by a restoration of energy.

15 Claims, 20 Drawing Sheets

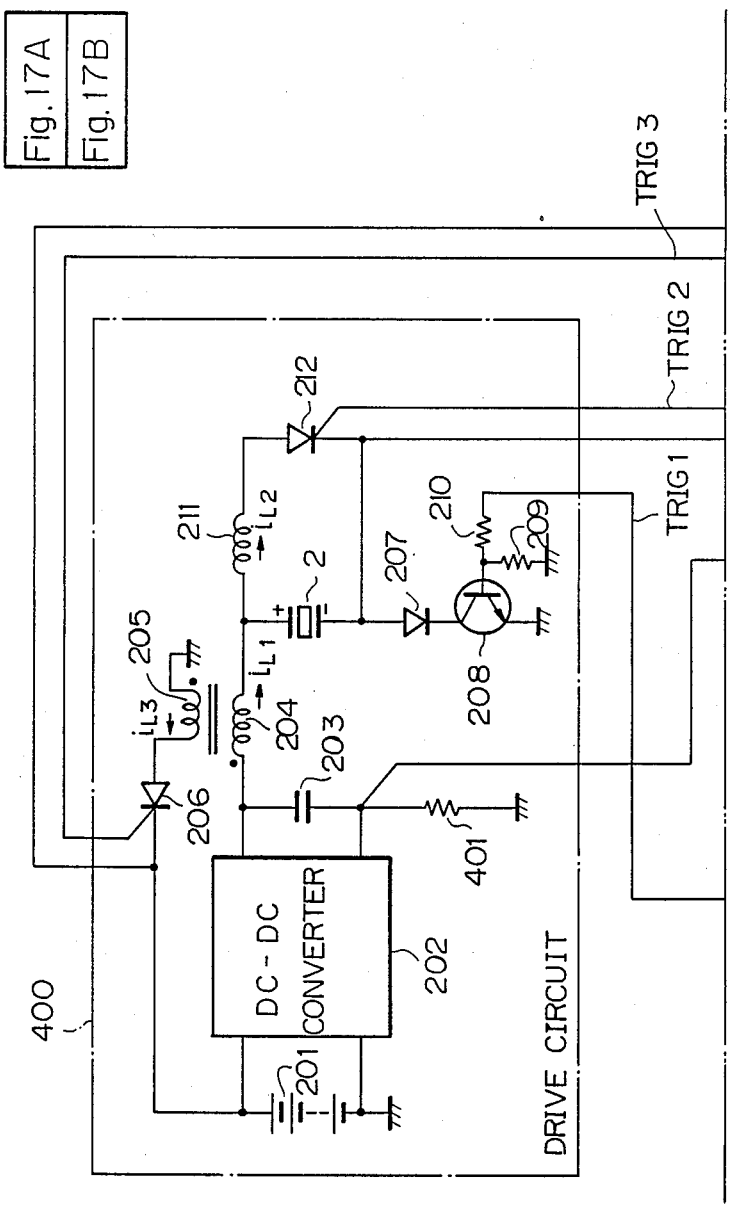

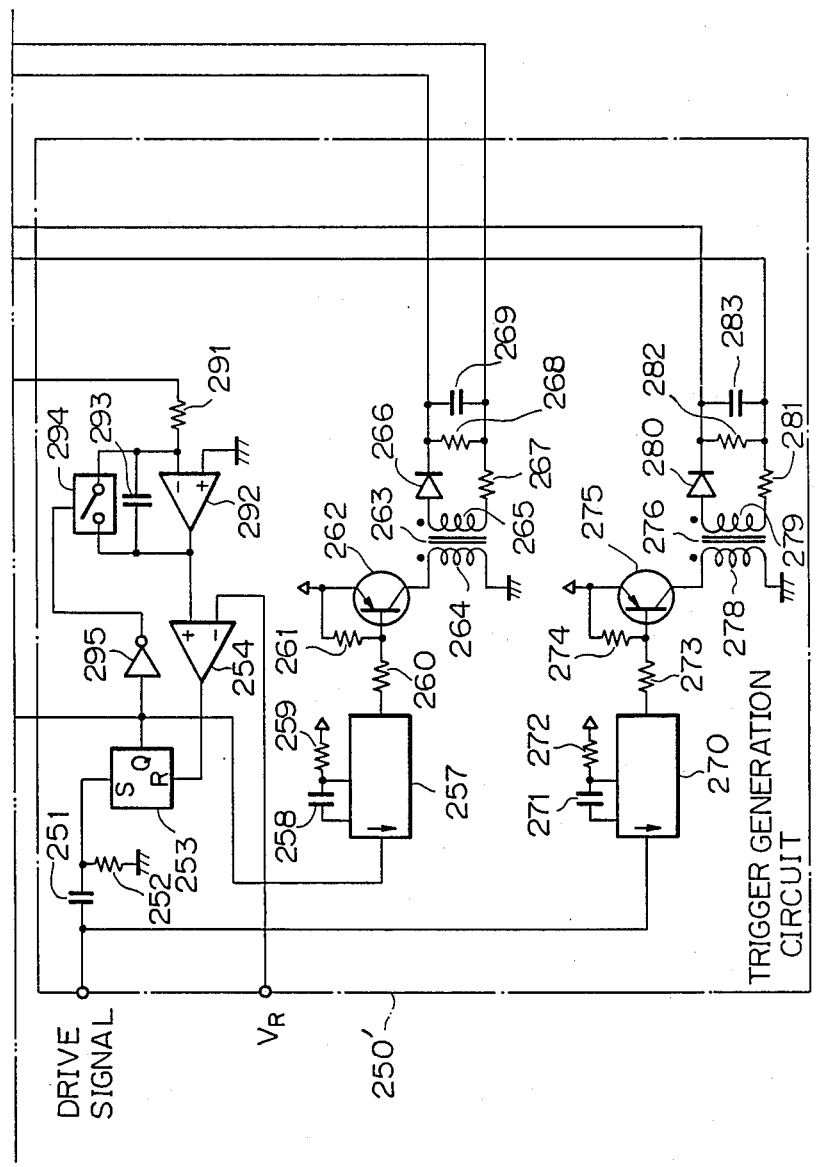

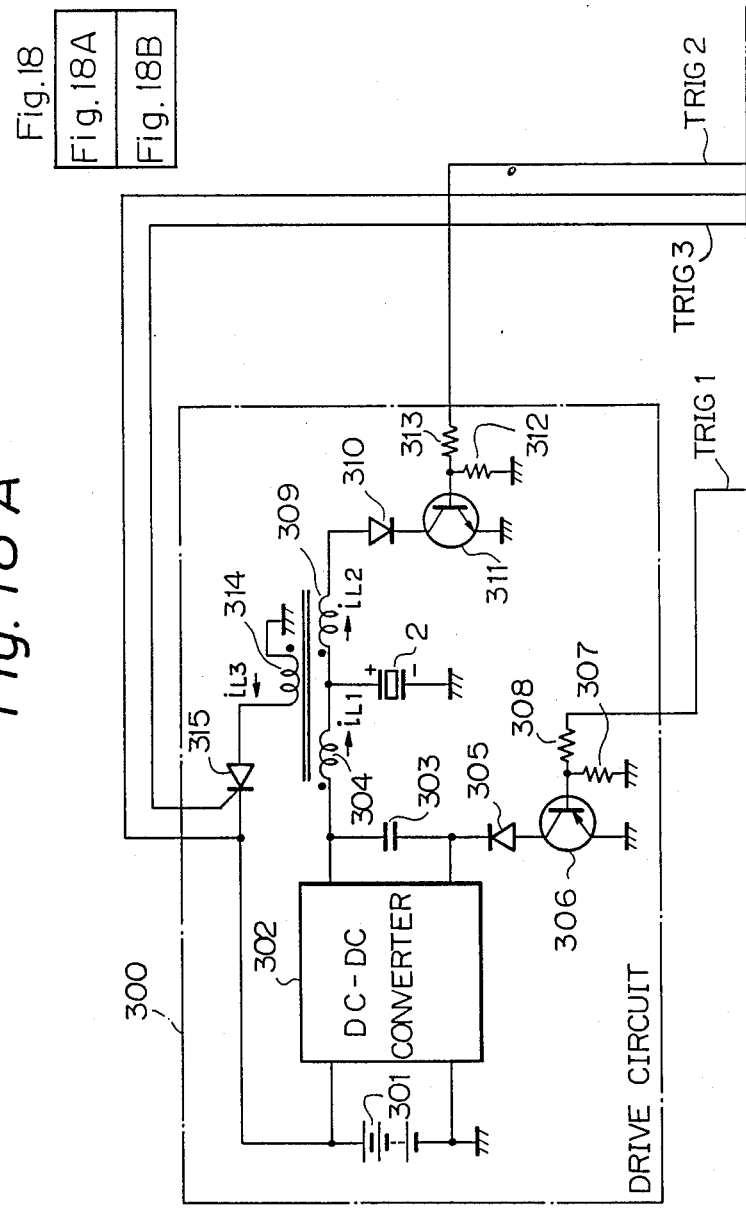

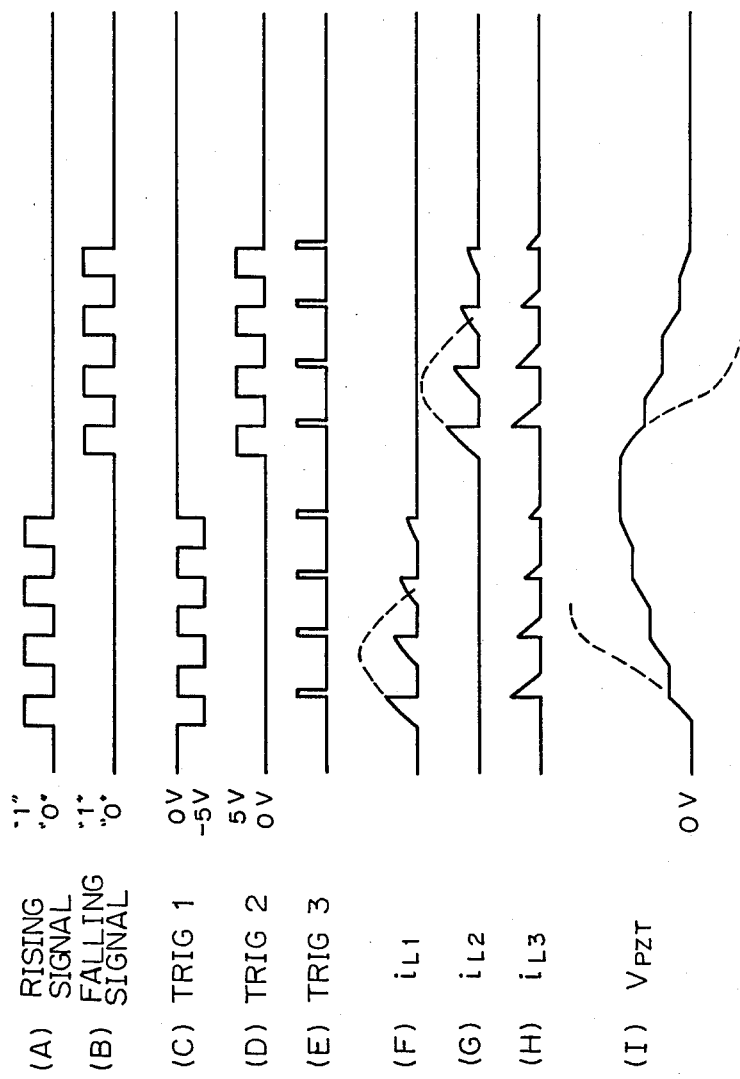

METHOD AND APPARATUS FOR DRIVING CAPACITIVE-TYPE LOAD

BACKGROUND OF THE INVENTION (1) Field of the Invention

The present invention relates to a method and an apparatus for driving a capacitive-type load. More particularly, it relates to a method and an apparatus for driving, for example, a piezoelectric actuator, electrostrictive actuator and the like used in a fuel injection valve of an internal combustion engine.

(2) Description of the Related Art

In a known driving circuit for a piezoelectric actuator including piezoelectric elements, the circuit comprises a thyristor and a coil connected in series, one of which is connected to the actuator in series and the other is connected to the actuator in parallel. This circuit utilizes a resonance phenomenon of the coil, and therefore, when a negative voltage is applied to the piezoelectric actuator, the actuator is deteriorated by polarization. Thus a problem of assuring the initial characteristic arises. Further, in the above-mentioned circuit, the voltage of the high voltage power source must be changed to control the expansion or contraction of the piezoelectric actuator. Also, the response characteristic thereof is not satisfactory. To eliminate these problems, another circuit which comprises an added amplifier and a transistor circuit is known. However, this circuit has a complicated structure and a high production cost, has a high energy-consumption when driving, caused by a resistance, and thus has a poor power efficiency plus heat generation occurs. The technical background for the present invention is disclosed in Japanese Patent Application No. 60-81432 (TAKIGAWA et al. U.S. application Ser. No. 850,696 filed on Apr. 11, 1986).

SUMMARY OF THE INVENTION

An object of the present invention is to provide a method and an apparatus for driving a capacitive-type load wherein the energy efficiency is raised by the regeneration of energy from a coil, an easy control of the expansion or contraction of a piezoelectric actuator as a capacitive-type load is realized, and is deteriorated by polarization is prevented.

To accomplish the above object, according to the present invention, there is provided a method for driving a capacitive-type load in an apparatus comprising a capacitive-type load; a direct current power source for driving the capacitive load; a charging circuit having a first coil and a first switching element connected in series with the capacitive-type load to the direct current power source; a discharge circuit having a second coil and a second switching element connected in series and connected across the terminals of the capacitive-type load; a third coil electromagnetically coupled with at least one of the first coil and the second coil; and a third switching element provided in series with the third coil and the direct current power source. The method comprises the following steps: closing the switching element connected to the either the first or second coil electromagnetically coupled to the third coil to allow a flow of electric current; opening the switching element closed by the closing step before the electric current flowing therethrough reaches zero; and closing the third switching element and supplying the energy generated in the coil to the direct current power source through the third coil and the third switching element when the switching element is open by the opening step.

In another aspect of the present invention there is provided, an apparatus for driving a capacitive-type load comprising a direct current power source, a capacitive-type load, a charging circuit, a discharging circuit, an electric circuit, and a secondary coil. The capacitive-type load is, for example, a piezoelectric actuator and expands and contracts when the load is charged and discharged, respectively. The charging circuit is connected in series with the power source and the capacitive-type load and charges the load by direct current from the power source. The discharging circuit is connected in parallel with the capacitive-type load and discharges the load. At least one of the charging circuit and the discharging circuit comprises a primary coil and a switching element and the coil and switching element are connected in series to each other. The electric circuit is connected to the switching element and turns the switching element ON and OFF. The secondary coil is electromagnetically coupled with the primary coil and is connected to the power source. Thus, in this apparatus fly-back energy generated when the switching element is turned OFF by the electric circuit is supplied to the power source.

Other features and advantages of the invention will be apparent from the following description with reference to the accompanying drawings.

BRIEF DESCRIPTION OF THE DRAWINGS

FIGS. 17A and 17B are a partial circuit diagram of an apparatus according to a third embodiment of the invention;

FIGS. 18A and 18B are a partial circuit diagram of an apparatus according to a fourth embodiment of the invention; and FIG. 19 is a timing diagram explaining the operation of the apparatus shown in FIGS. 18A and 18B.

DESCRIPTION OF THE PREFERRED EMBODIMENTS

Prior to the explanation of the embodiments of the invention, the related arts are explained as a comparison.

Figure 1:
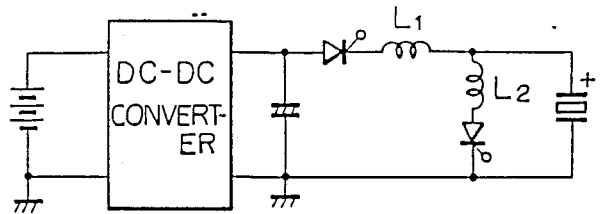
FIG. 1, FIG. 2, and FIG. 3 are circuit diagrams showing conventional drive circuits for a capacitive-type load.
Figure 2:
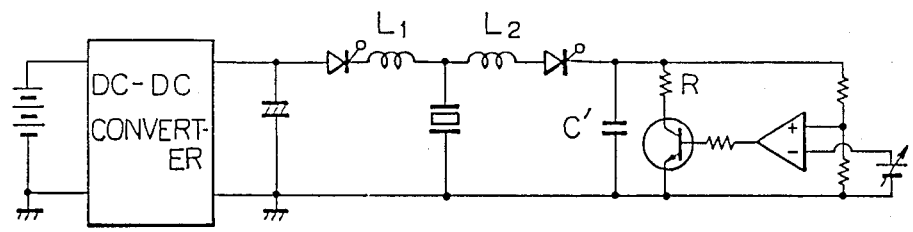

An example of a conventional driving circuit for a capacitive-type load is shown in FIG. 1. This circuit utilizes a coil resonance phenomenon. In this circuit, as mentioned before, a negative voltage is applied to a piezoelectric actuator and deterioration by polarization occurs. Also, in the circuit of FIG. 1, to control an expansion or contraction of the piezoelectric actuator, the voltage of the high voltage power source must be changed. The conventional circuit shown in FIG. 2 is an attempt to solve these problems. This circuit, however, has complicated structure, a high production cost, and a low efficiency.

Figure 4:
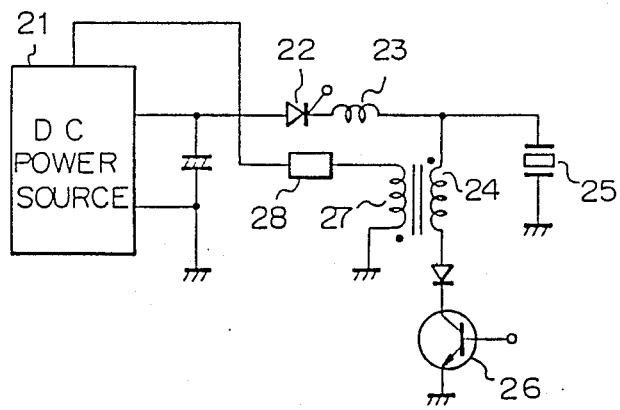
FIG. 4 is a circuit diagram explaining a principle of the present invention.
Figure 9:
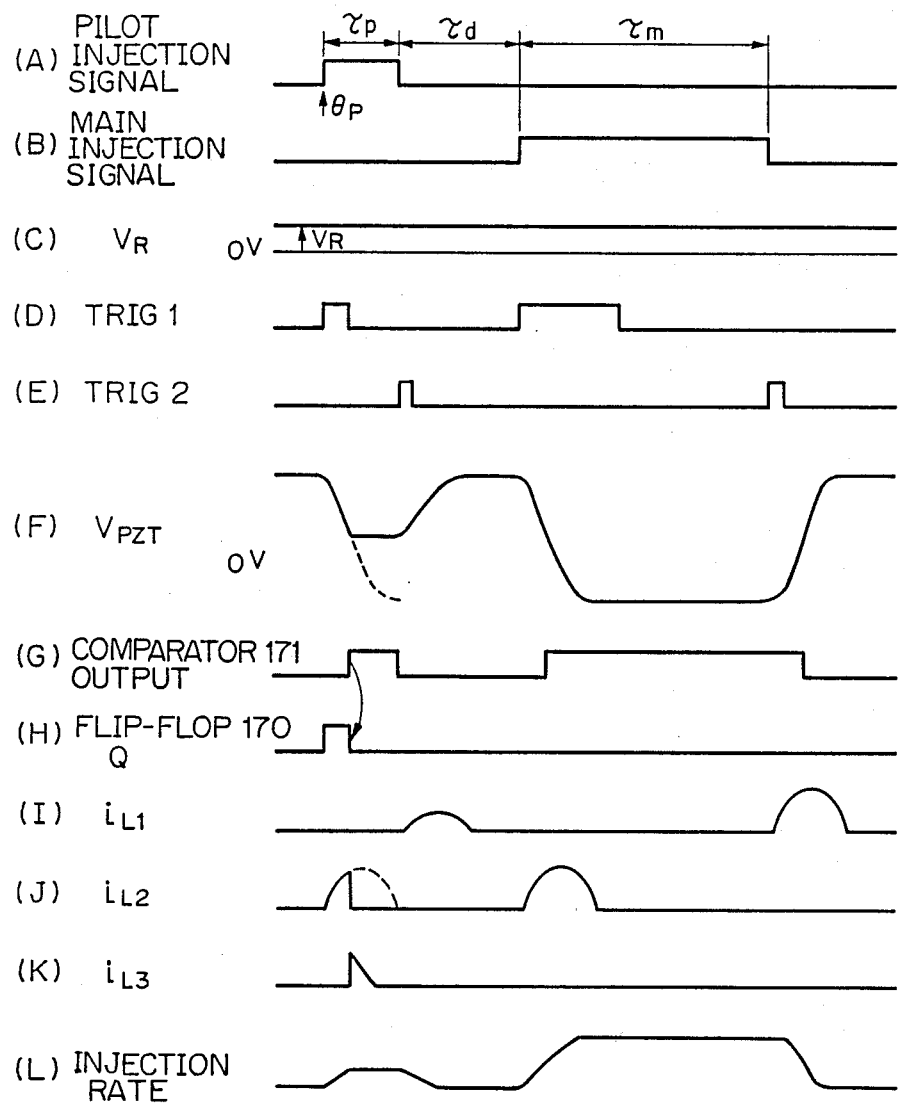
FIG. 9 is a timing diagram explaining an operation of the apparatus shown in FIG. 5.

The principle of the invention is now explained with reference to FIG. 4 and FIG. 9. In FIG. 4, 21 denotes a direct current power source, 22 a first switching element, 23 a first coil, 24 a second coil, 26 a second switching element, 25 a capacitive-type load, 27 a third coil, and 28 a third switching element. In this circuit, when the voltage ($V_{PZT}$) across the capacitive-type load is high, as shown at the left of FIG. 9(F), the second switching element 26 is turned ON by a trigger (TRIG) 1 (FIG. 9). The voltage $V_{PZT}$ is discharged through the coil 24 and the switching element 26, but before the discharge current reaches zero, the second switching element 26 is opened. The fly-back energy generated at that time in the second coil 24 is supplied to the direct current power source 21 through the third coil 27 which is magnetically coupled with the coil 24 and the third switching element 28, and subsequently, the first switching element 22 is triggered by a trigger 2 (FIG. 9) and the capacitive-type load 25 is charged to a high voltage through the first coil 23.

Figure 5:
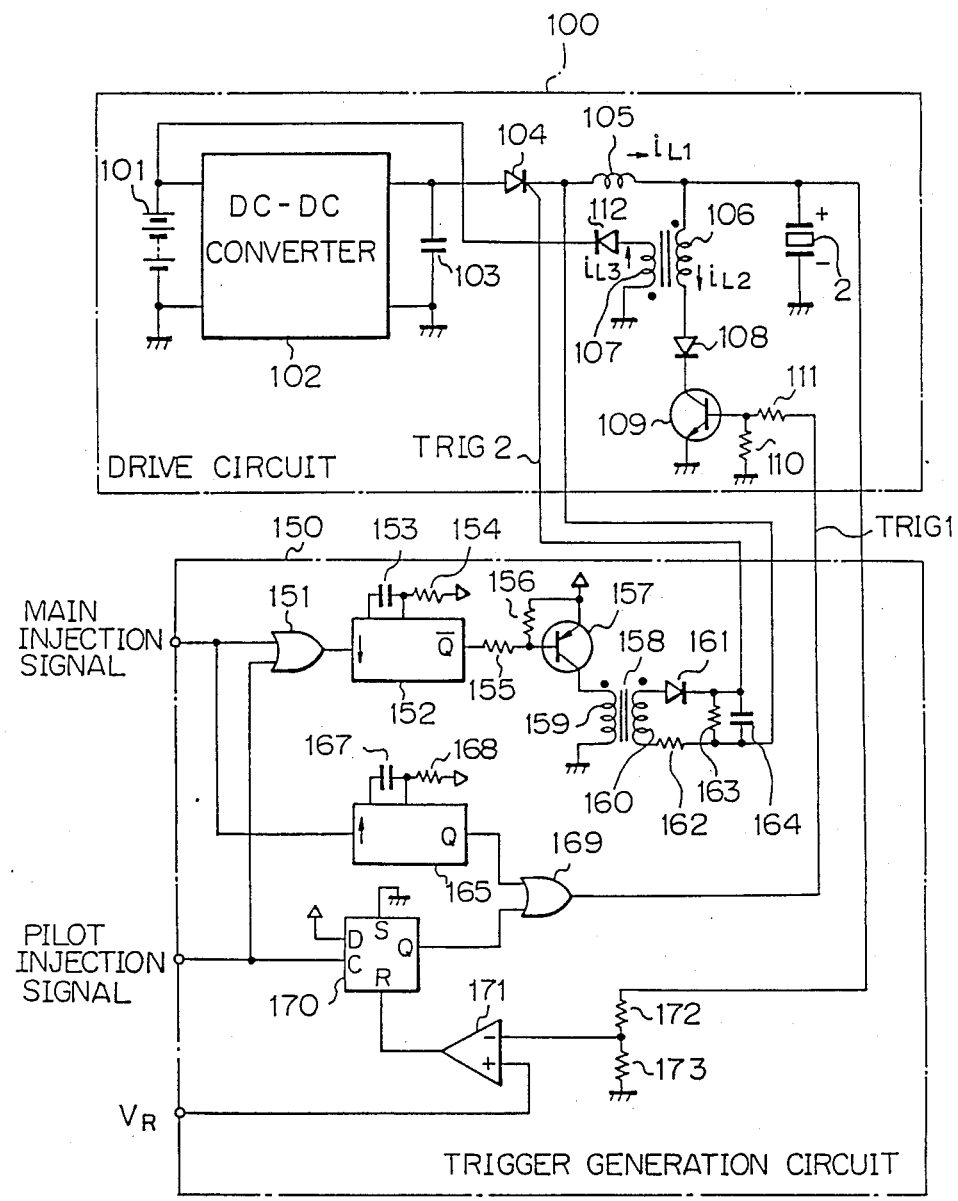
FIG. 5 is a partial circuit diagram of an apparatus for driving a capacitive-type load according to a first embodiment of the present invention.

A first embodiment of the present invention is shown in FIG. 5. In FIG. 5, a block 100 is a drive circuit and a block 150 is a trigger generation circuit. These blocks 100 and 150 constitute a driving circuit for a piezoelectric actuator applied, for example, to a fuel injector.

Figure 7:
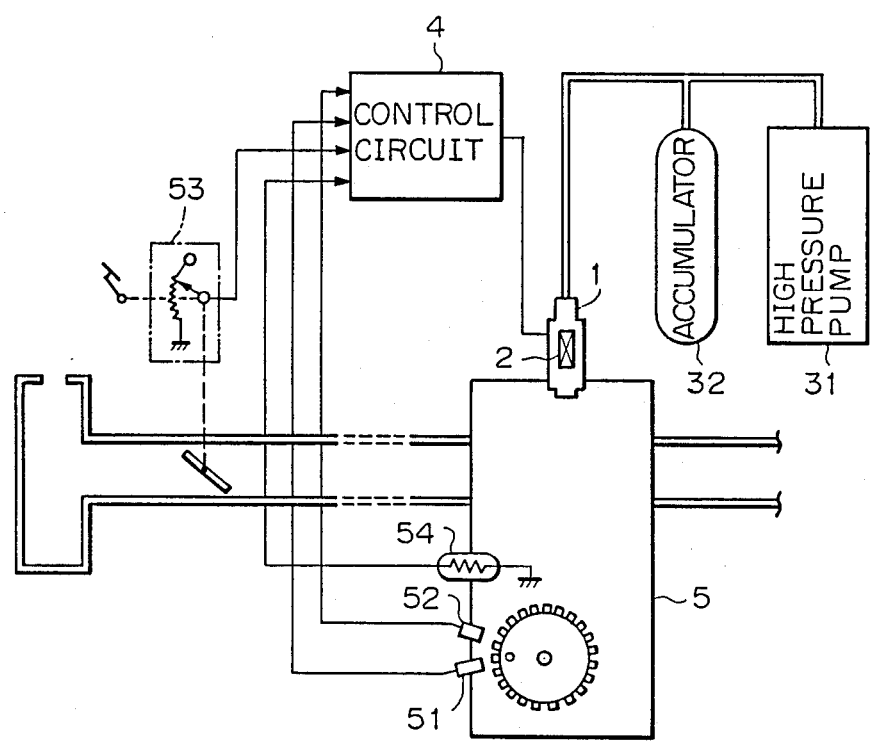
FIG. 7 is a schematic diagram of an internal combustion engine to which the invention is applied.
Figure 8:
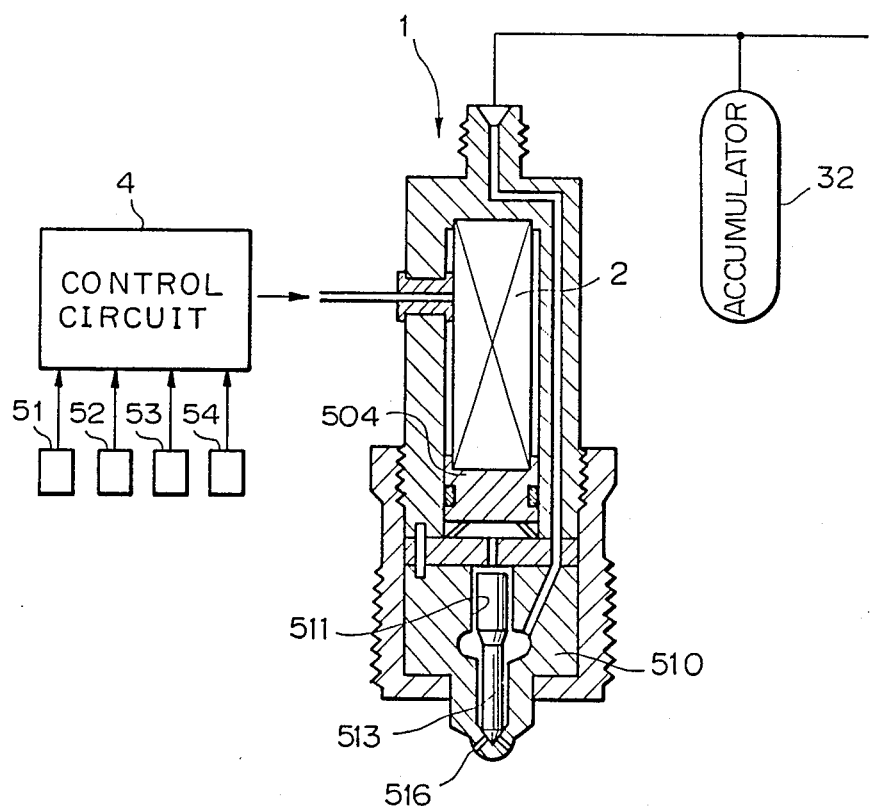
FIG. 8 is a sectional view of a fuel injection valve to which the invention is applied.

FIG. 7 shows a schematic diagram of an internal combustion engine, and FIG. 8 shows a sectional view of the fuel injection valve. These Figures show the system and constitution of an injector in which a needle is moved up and down by the expansion and contraction of the piezoelectric actuator, thus opening and closing a valve to control an amount and time of a fuel injection. The construction, operation, control method, and constant injection rate thereof are described in detail in Japanese Patent Application No. 60-81432 (TAKIGAWA et al. U.S. application Ser. No. 850,696 filed on Apr. 11, 1986). In FIG. 7, 1 denotes a fuel injection valve, 2 a piezoelectric actuator, 4 a control circuit, 5 a Diesel engine, 31 a high pressure pump, and 32 an accumulator. In FIG. 8, in addition to the above elements, 504 denotes a piston, 510 a nozzle body, 511 a needle cylinder, 513 a nozzle needle, and 516 an injection nozzle.

The drive circuit 100 in FIG. 5 is explained below. In this circuit 100, the battery 101 is the type normally used for an automobile, and a DC-DC converter 102 generates a high voltage from the voltage supplied thereto by the battery 101. This high voltage is stored in a capacitor 103. The DC-DC converter 102 is a well known step-up voltage type using a transformer. The anode of a thyristor 104 is connected to the capacitor 103 at the high voltage power side, and the cathode of the thyristor 104 is connected to a coil 105 having an inductance. The gate of the thyristor 104 is connected to a trigger generation circuit 150. The other terminal of the coil 105 is connected to the positive terminal of a piezoelectric actuator 2, and the negative terminal of the piezoelectric actuator 2 is grounded. Thus, the capacitor 103, the thyristor 104, the coil 105, and the piezoelectric actuator 2 form a series resonance circuit.

The positive terminal of the piezoelectric actuator 2 is also connected to a coil 106 having an inductance. A coil 107 is wound with the coil 106 and these coils 106 and 107 are magnetically coupled to each other. The polarities of the coils 106 and 107 are reversed, as shown in FIG. 5. The other terminal of the coil 106 is connected to the collector of a transistor 109 through a diode 108, and thus the piezoelectric actuator 2, the coil 106, a diode 108, and the transistor 109 form a series resonance circuit. The diode 108 is provided to prevent the application of a negative voltage to the collector of the transistor 109. The emitter of the transistor 109 is grounded, and the base of the transistor 109 is connected to the trigger generation circuit 150 through resistances 110 and 111. One terminal of the coil 107 is grounded and the other is connected to the battery 101 through a diode 112 as the third switching element, which diode turns ON or OFF responding to the value and polarity of the applied voltage thereacross.

The trigger generation circuit 150 is explained below. Input to the trigger generation circuit 150 are a main injection signal, a pilot injection signal, and a comparison signal $V_R$, and these signals are supplied from an ECU 41, as described later. The main injection signal is applied to one input of a two input OR gate 151 and the pilot injection signal is applied to the other input of the OR gate 151. The logical sum of the main injection signal and the pilot injection signal is output from the OR gate 151, and this output is supplied to the falling edge trigger input of a monostable multivibrator 152, which is triggered at the falling edge of the input signal. The monostable multivibrator 152 outputs a pulse as $\overline{Q}$, having pulse width which is determined by a capacitor 153 and a resistance 154, synchronized with the falling edge of the trigger signal. The output $\overline{Q}$ is the signal having a negative logic, and thus $\overline{Q}$ is brought to a logical "0" level during a determined time interval. The time interval is approximately 30 microseconds when this signal $\overline{Q}$ is used as a trigger signal for the thyristor 104.

The output $\overline{Q}$ of the monostable multivibrator 152 is supplied to the base of a transistor 157 through a resistance 155. The transistor 157 is PNP type having an emitter directly connected to a power source and a base connected to the power source through a resistance 156. The collector of the transistor 157 is connected to a primary winding 159 of a pulse transformer 158. When the output $\overline{Q}$ of the monostable multivibrator 152 is "0" level, the transistor 157 is conductive, an electric current flows through the primary winding 159 of the pulse transformer 158, and a signal is generated across a secondary winding 160. This signal is supplied to the gate input of the thyristor 104 through a diode 161 and a resistance 162. A resistance 163 and a capacitor 164 are used to prevent the generation of noise.

The above-mentioned main injection signal is supplied to the rising edge trigger input of a monostable multivibrator 165. The pulse width of the pulse output from the monostable multivibrator 165 is determined by a resistance 168 and a capacitor 167, and in this embodiment, is approximately 100 microseconds. The output Q of the monostable multivibrator 165 is supplied to one input of a two input OR gate 169, and the output of the two input OR gate 169 turns the transistor 109 ON or OFF through the resistances 110 and 111 as mentioned above. The data input D of a D flip-flop 170 is supplied at a "1" level and a set input S is connected to the ground level. The pilot injection signal is connected to a clock input C of the D flip-flop 170, and at the rising edge thereof, the data input level is latched and output. The output of a comparator 171, which will be mentioned later, is supplied to the reset input R of the D flip-flop 170, and the comparison voltage $V_R$ from the ECU 41 is supplied to the non-inversion (+) input of the comparator 171. A signal, the voltage of which is divided across the piezoelectric actuator 2 by 300 by using resistances 172 and 173, is supplied to the inversion (−) input of the comparator 171.

Figure 6:
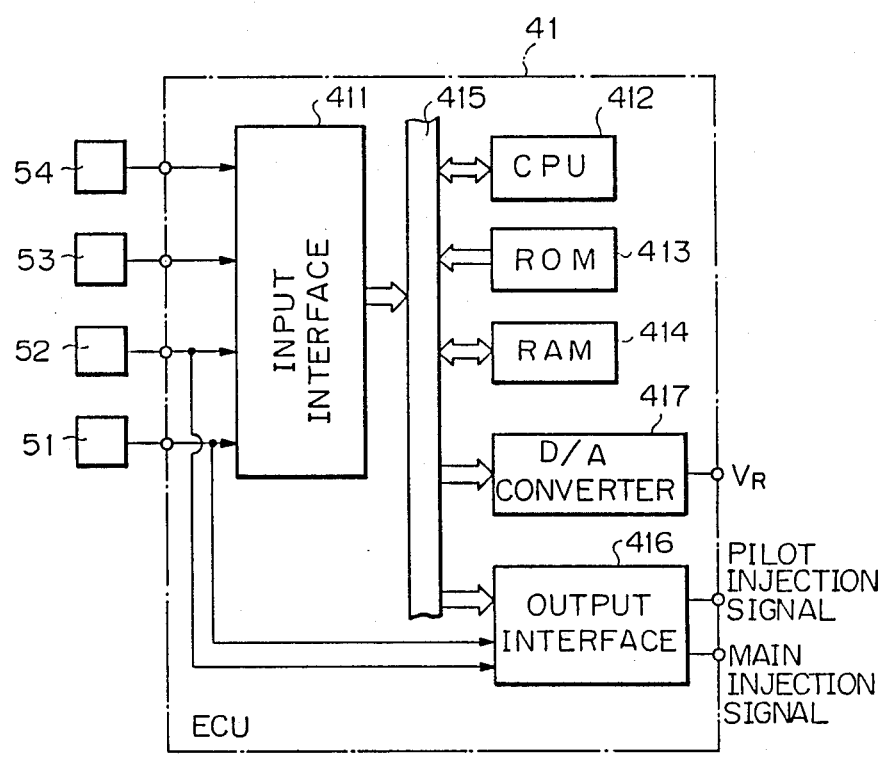
FIG. 6 is a block diagram of an ECU (Electric Computing Unit) in a controller for a fuel injection valve to which the invention is applied.

The ECU (electronic computing unit) 41 which outputs the main injection signal, the pilot injection signal, and the comparison voltage $V_R$ is explained below. FIG. 6 shows a constitution of the ECU 41, wherein an input interface 411 converts a voltage in response to an accelerator pedal opening rate supplied from an engine load sensor 53, and another voltage in response to a water temperature supplied from a temperature sensor 54, from analog to digital, and supplies the converted signals to a bus 415. Further the interface 411 counts the engine revolution number, from signals input by a reference sensor 52 and an angle sensor 51, and supplies the count to the bus 415. The data from the input interface 411 is input to a CPU (central processor unit) 412. The CPU 412 operates the various data in response to commands from a ROM (read only memory) 413 in which a program is stored. A RAM (random access memory) 414 is used for the operation in the CPU 412. The data are sent and received between the circuits such as the input interface 411 and so on through the bus 415. When the data for the injection signals operated by the CPU 412 is set, an output interface 416 performs a predetermined counting operation, and outputs the main injection signal and the pilot injection signal at a predetermined timing. A digital-to-analog conversion (D/A) circuit 417 converts the comparison voltage data operated by the CPU 412 to an analog voltage $V_R$.

The operation of the above-mentioned circuit constitution is now explained. The main injection signal, the pilot injection signal, and the comparison voltage $V_R$ are output by the ECU 41. The engine revolution number $N_E$, the accelerator pedal opening rate $\theta$, and the water temperature T are input to the CPU 412, and the CPU 412 then calculates a pilot injection time $\theta_P$, a pilot injection period $\tau_p$, a pilot-main injection interval $\tau_d$, a main injection period $\tau_m$, and the comparison voltage $V_R$ at a predetermined engine condition, using a map which is obtained by a bench test and stored in the ROM 413. These values are then, output to the output interface 416 and the D/A converter 417. The output interface 416 receives the reference signal, the angle signal, and a reference clock signal, and outputs the pilot injection signal and the main injection signal at a predetermined timing.

These signals are supplied to the trigger generation circuit 150, and the D flip-flop 170 is triggered at the rising edge of the pilot injection signal and the output Q thereof becomes level "1" (FIG. 9(H)). This signal makes the transistor 109 conductive through the two-input OR gate 169 (FIG. 9(D)). When the transistor 109 is conductive, the series resonance circuit constituted by the piezoelectric actuator 2, the coil 106, the diode 108, and the transistor 109, is activated, and thus the charges in the piezoelectric actuator 2 are reduced, i.e., the piezoelectric actuator 2 is contracted. When the voltage ($V_{PZT}$) across the piezoelectric actuator 2 falls to a predetermined voltage, the voltage of the inversion input signal of the comparator 171 is less than the comparison voltage $V_R$, the output of the comparator 171 is "1" level (FIG. 9(G)), and the D flip-flop 170 is reset (FIG. 9(H)). That is, the output Q of the D flip-flop 170 is "0" level and the transistor 109 is cut off (FIG. 9(J)). At the time of this cut off, the electric current through the coil 106 is considerably large, therefore, if this electric current is abruptly cut off, a spike voltage is generated and the transistor 109 is destroyed.

In the present invention, since the coil 107 coupled with the coil 106 is provided, the energy stored in the coil 106 is supplied to the battery 101 through the coil 107. Namely, the coil 107 is wound in reverse to the coil 106, and therefore, the electric current through the coil 106 is transformed at the coil 107, and flows into the battery 101 through the diode 112 (FIG. 9(K)). Accordingly, as the voltage applied to the coil 106 is product of the battery voltage and the winding ratio between the coils 106 and 107, the applied voltage can be suppressed within a predetermined voltage rating. Moreover, since energy can be returned to the battery as a regeneration power, compared with the diffusion of heat energy in the prior art, this energy regeneration provides a greater decrease in power consumption and heat generation.

As mentioned above, the voltage at the contraction of the piezoelectric actuator 2 can be arbitrarily controlled in response to the comparison voltage $V_R$ and with a better response characteristic (FIG. 9(F)). Also, the contraction value of the piezoelectric actuator 2 can be controlled by changing the voltage at the contraction, whereby the needle lift value of the injection valve can be changed, and finally, the injection rate can be arbitrarily controlled (FIG. 9(L)).

First the monostable multivibrator 152 is triggered at the falling edge of the pilot injection signal, and then the thyristor 104 is triggered (FIG. 9(E)). As a result, the thyristor 104 is conductive and the high voltage stored in the capacitor 103 is applied to the piezoelectric actuator 2 through the thyristor 104 and the coil 105 (FIG. 9(F)). Accordingly, the piezoelectric actuator 2 is expanded, the injector valve is closed, and the injection is interrupted. After a predetermined interval, the main injection signal is supplied and the monostable multivibrator 165 is triggered at the rising edge of this signal, and the transistor 109 becomes conductive during a predetermined interval (FIG. 9(D)). This interval is determined to be longer than a half of the series resonance period, which is effected by the piezoelectric actuator 2 and the coil 106. Since the transistor 109 is conductive and charge in the piezoelectric actuator 2 is discharged to a negative value, the piezoelectric actuator 2 is considerably contracted (FIG. 9(F)). As a result, the injector is fully open and a large injection is carried out (FIG. 9(L)). Then the monostable multivibrator 152 is triggered at the falling edge of the main injection signal, the thyristor 104 is made conductive, a high voltage is applied to the piezoelectric actuator 2, and the injection is completed.

As mentioned above, with this driving circuit, the voltage at the contraction of the piezoelectric actuator 2 can be arbitrarily controlled, moreover, instead of the diffusion of heat energy occurring in the prior art, the energy is returned to the battery. Thus, the circuit of the first embodiment has superior features which provide a low power consumption and a small size and light weight apparatus.

In this embodiment, an example of application thereof to an injector is explained, however, the invention is not limited to this example. The invention can be widely utilized for controlling the voltage of a capacitive-type load with a reliable response characteristic and a wide range of control.

Further, in this embodiment, assuming that only the pilot injection signal is used and the comparison voltage $V_R$ is zero volt, an application to the piezoelectric actuator 2 of a negative voltage can be prevented, and thus fluctuations in the expansion and contraction caused by a deterioration of the actuator because of polarization can be suppressed.

Figure 10A:
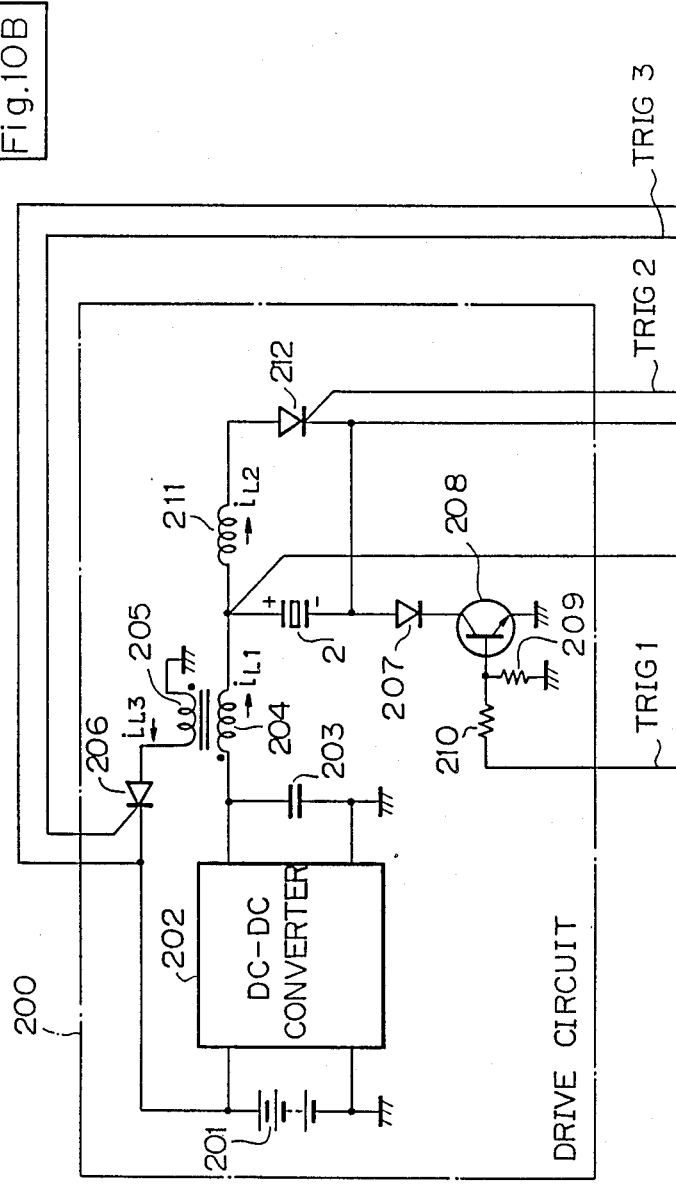
FIGS. 10A and 10B are a partial circuit diagram of an apparatus for driving a capacitive load according to a second embodiment of the invention.
Figure 10B:
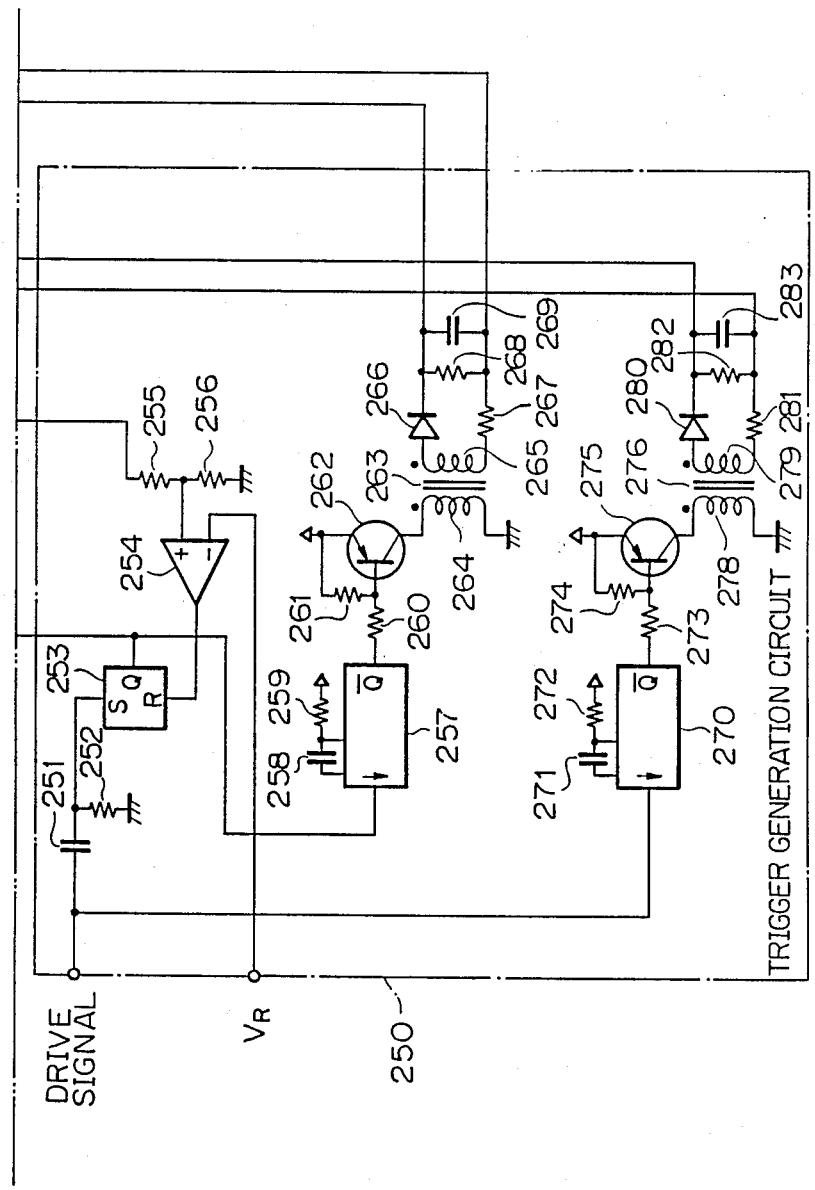

A second embodiment is now explained. FIGS. 10A and 10B are a circuit diagram showing a partial constitution of a driving circuit for a piezoelectric actuator in a second embodiment of the invention. An example wherein the driving circuit is applied to an injector using a piezoelectric actuator is explained below.

Figure 3:
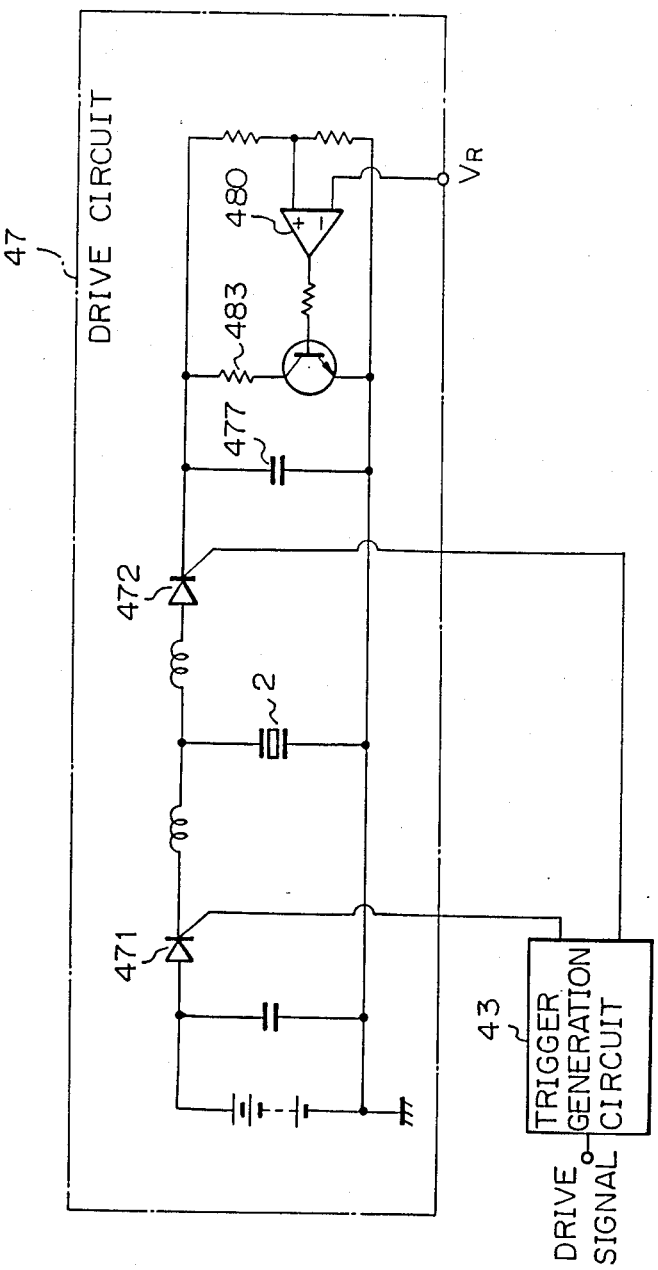
Figure 12:
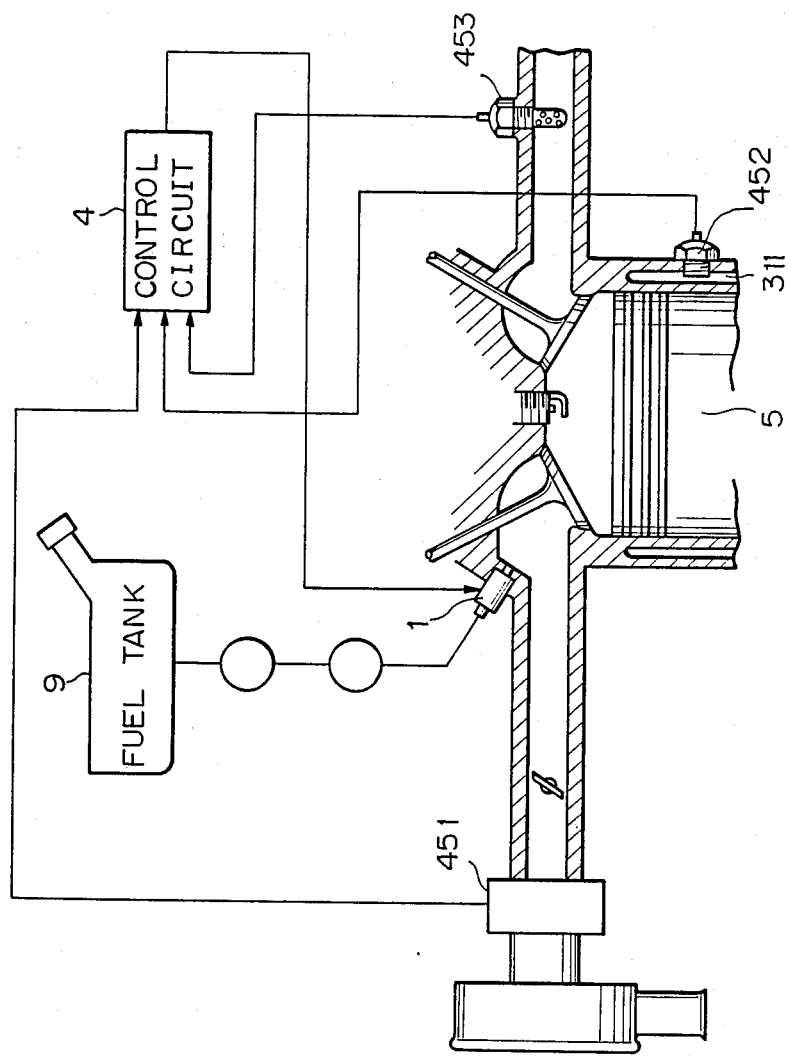
FIG. 12 is a partially sectional view of an internal combustion engine showing the location of a fuel injection valve to which the apparatus shown in FIGS. 10A and 10B is applied.
Figure 13:
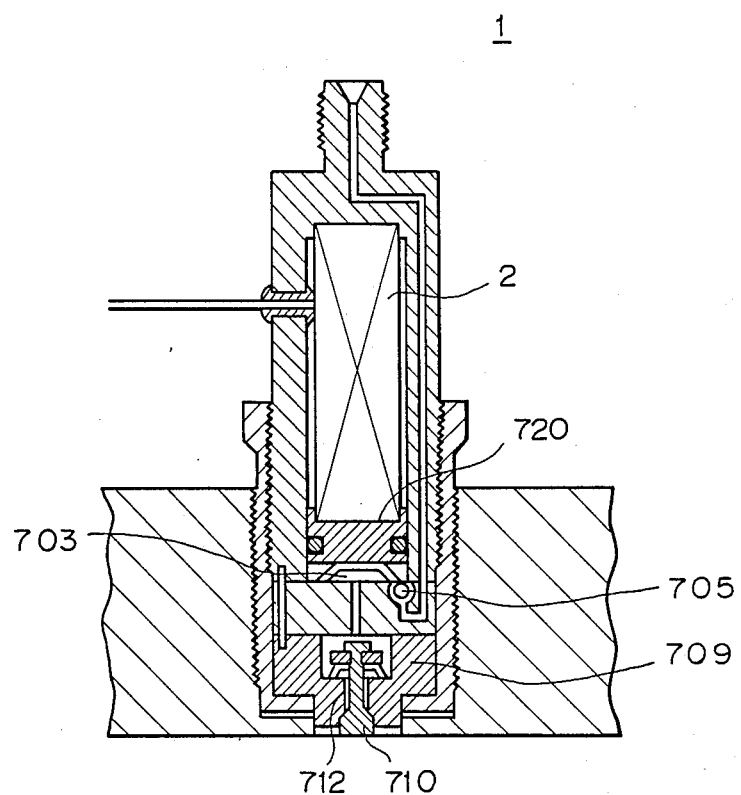
FIG. 13 is a sectional view of the fuel injection valve shown in FIG. 12.

FIG. 12 and FIG. 13 are sectional views showing a system and a construction of a fuel injection valve which moves a piston 720 up and down by utilizing the expansion and contraction of the piezoelectric actuator 2, pressurizes fuel supplied to a pump chamber 703, and injects the fuel from a injection nozzle 712. However, the operating range of this fuel injection valve is limited narrower, and therefore, a conventional drive circuit 47 in FIG. 3 has been used to change the stroke of the piston and control the injected fuel amount but the drive circuit 47 in FIG. 3 has a complicated structure, a high cost, and a low efficiency because of power dissipation in a resistance 483 by the discharge of the stored charge in a capacitor 477. Thus, a problem arises in that the drive circuit cannot be miniaturized because of the heat generated therein. In FIG. 3, reference numerals 471 and 472 denote thyristors, 43 denotes a trigger generation circuit, and 480 denotes an operational amplifier. In FIG. 13, reference numerals 709 and 710 denote a nozzle body and a nozzle needle, respectively.

The drive circuit 200 in FIG. 10A is explained below. A battery 201 generates a high voltage through a DC-DC converter 202, and the high voltage is stored in a capacitor 203. A coil 204 having an inductance is connected between the capacitor 203 and a positive terminal of a piezoelectric actuator 2. A coil 205 is wound and electromagnetically coupled with the coil 204. The polarities of the coils 204 and 205 are reversed, as shown in FIG. 10A. One terminal of the coil 205 is grounded and the other terminal is connected to the battery 201 through a thyristor 206. The gate of the thyristor 206 is connected to a trigger generation circuit 250, which will be explained later.

The positive terminal of the piezoelectric actuator 2 is connected to the coil 204 as mentioned above, and the negative terminal thereof is connected to the collector of a transistor 208 through a diode 207. The emitter of the transistor 208 is grounded. In this manner, the capacitor 203, the coil 204, the piezoelectric actuator 2, the diode 207, and the transistor 208 constitute a series resonance circuit. The base of the transistor 208 is connected to the trigger generation circuit 250 through resistances 209 and 210. The positive terminal of the piezoelectric actuator 2 is further connected to a coil 211. The anode of a thyristor 212 is connected to the coil 211 and the cathode thereof is connected to the negative terminal of the piezoelectric actuator 2. Thus, the piezoelectric actuator 2, the coil 211, and the thyristor 212 constitute a series resonance circuit. The gate of the thyristor 212 is connected to the trigger generation circuit 250.

The trigger generation circuit 250 is now explained. A drive signal and a comparison signal $V_R$ which are output from an ECU 41', which will be explained later, are sent to the trigger generation circuit 250. A capacitor 251 and a resistance 252 form a differential circuit and the circuit forms a pulse synchronized with a rising edge of the drive signal. This signal is supplied to a set terminal S of a flip-flop 253, to set the flip-flop 253. Namely, the output Q of the flip-flop 253 is "1" level. The reset terminal R of the flip-flop 253 is connected to the output of a comparator 254. The non-inversion (+) input of the comparator 254 receives a divided signal, which is divided the voltage across the piezoelectric actuator 2 by 300 using resistances 255 and 256. The inversion (−) input of the comparator receives the comparison signal $V_R$.

The output Q of the flip-flop 253 represents the trigger (TRIG) 1 signal and is connected to a base resistance 210 of the transistor 208. When the output Q is "1" level, the transistor 208 is conductive. The output Q of the flip-flop 253 is supplied to the falling edge trigger input of a monostable multivibrator 257, which trigger input receives a falling edge of an input pulse and operates the flip-flop 257.

The output pulse width of the monostable multivibrator 257 is determined by a capacitor 258 and a resistance 259. The pulse width is approximately 30 microseconds, which is the time necessary to trigger the thyristor 206. The output $\overline{Q}$ of the monostable multivibrator 257 is supplied to the base of a transistor 262 through resistances 260 and 261. The emitter of the transistor 262 is connected to a power source, and the collector of the transistor 262 is connected to a primary winding 264 of a pulse transformer 263. When the output $\overline{Q}$ of the monostable multivibrator 257 is "0" level, the transistor 262 is conductive, the electric current flows through the primary winding 264 of the pulse transformer 263, and a signal is generated across a secondary winding 265. This signal is the trigger (TRIG) 3 signal and is supplied to the gate input of the thyristor 206 through a diode 266 and a resistance 267. A resistance 268 and a capacitor 269 prevent the generation of noise.

The drive signal is further applied to a falling edge trigger input of a monostable multivibrator 270. The following circuit is the same as that for the trigger 3 signal, and therefore, the explanation thereof has been abbreviated. A trigger (TRIG) 2 signal is generated synchronously with the falling edge of the drive signal, and triggers the thyristor 212.

Figure 11:
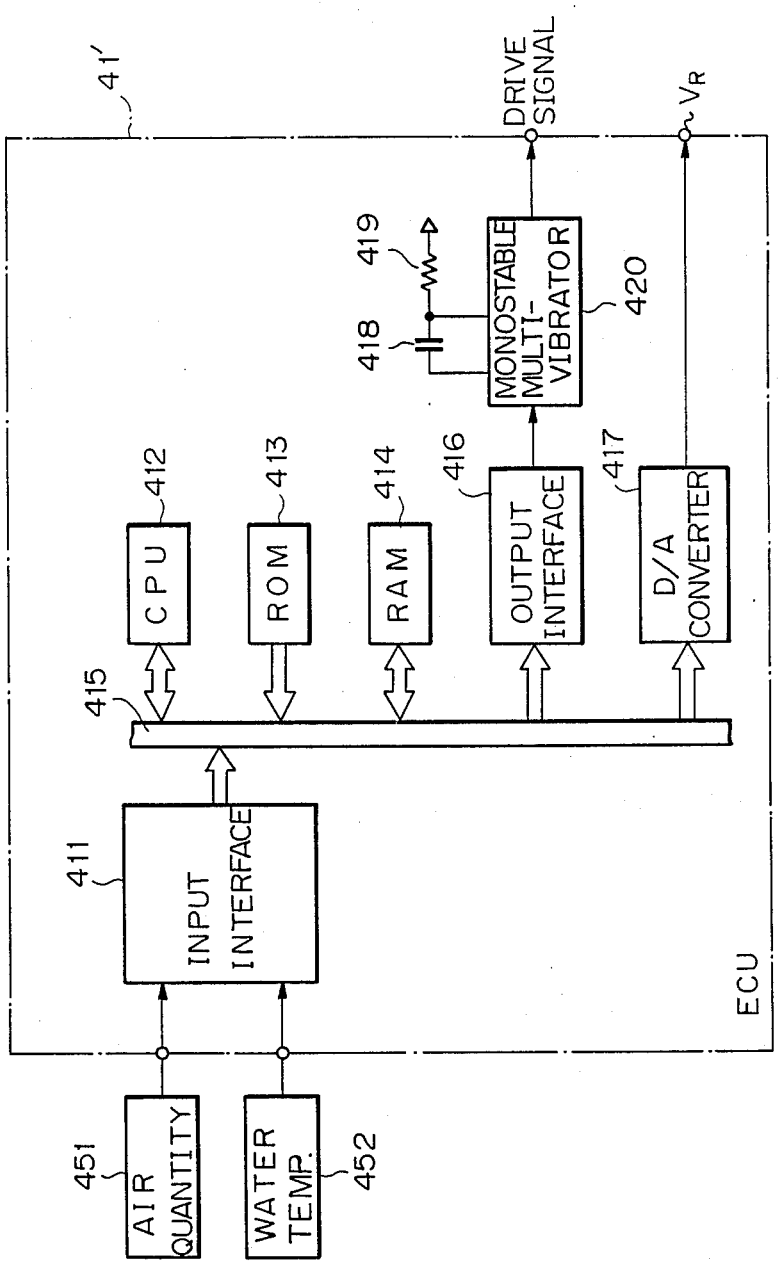
FIG. 11 is a block diagram of an ECU supplying signals to the apparatus shown in FIG. 10B.

The ECU 41', which receives the drive signal and the comparison signal $V_R$, is explained as follows. FIG. 11 is a block diagram showing the constitution of the ECU 41'. An air quantity sensor 451 is a known vane type or hot-wire type and measures the intake air quantity of an engine. A water temperature sensor 452 is mounted on the engine and measures the temperature of cooling water. An input interface 411 carries out an analog-to-digital conversion of the outputs of the air quantity sensor 451 and water temperature sensor 452 and outputs the digital outputs to a bus 415. A CPU 412 operates and controls data and program in the ECU 41', and a ROM 413 stores program and various data. Reference numeral 414 denotes a RAM.

An output interface 416 is loaded with a digital value in response to a driving frequency operated by the CPU and a signal indicating that the driving frequency is formed. A monostable multivibrator 420 receives the signal from the output interface 416 and outputs a drive signal having a predetermined pulse width synchronized with the driving frequency signal. The pulse width is determined by the time constant of a capacitor 418 and a resistance 419, and in this case, is approximately 500 microseconds. A D/A conversion circuit 417 converts a digital signal corresponding to the comparison signal $V_R$, which is operated by the CPU 412, to an analog voltage and outputs this voltage to the trigger generation circuit 250.

Figure 14:
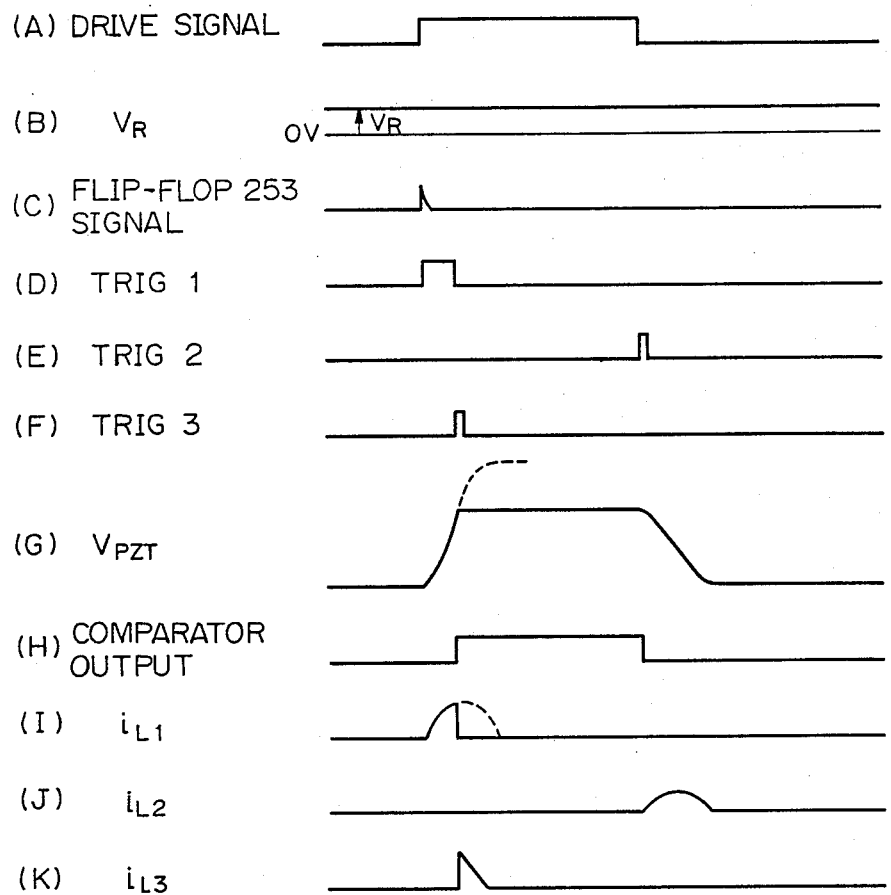
FIG. 14 is a timing diagram explaining the operation of the apparatus shown in FIGS. 10A and 10B.

The operation of the ECU 41' is now explained. The CPU 412 reads the intake air quantity from the input interface 411, and operates a basic injection quantity $q_{BASE}$ from which a predetermined air-fuel ratio is obtained, from the intake air quantity. Then, the CPU 412 reads the water temperature data from the input interface 411, reads a quantity increase factor K from quantity increase map data in response to the water temperature stored already in the ROM 413, and operates a final injection quantity $q_{FIN}=K \cdot q_{BASE}$. After the $q_{FIN}$ is obtained, the CPU 412 reads a driving frequency map stored in the ROM 413 and a comparison signal $V_R$ map, and reads a driving frequency f and the comparison signal $V_R$. The data of the driving frequency is output from the output interface 416 and triggers the monostable multivibrator 420, and the output of the monostable multivibrator 420 is the driving signal as shown in FIG. 14(A). The data of the comparison signal is output from the D/A conversion circuit 417 as the comparison signal $V_R$ (FIG. 14(B)).

The drive signal applied to the trigger generation circuit 250 is differentiated through the capacitor 251 and the resistance 252 (FIG. 14(C)) and the flip-flop 253 is set at the rising edge thereof. Namely, the output Q of the flip-flop 253 is "1" level, and makes the transistor 208 conductive (FIG. 14(D)). Thus, the capacitor 203, the coil 204, the piezoelectric actuator 2, the diode 207, and the transistor 208 constitute a series resonance circuit. Then, the high voltage stored in the capacitor 203 is applied to the piezoelectric actuator 2 (FIG. 14(G)). At that time, the voltage at the negative terminal of the piezoelectric actuator 2 is the summation of the forward voltage drop of the diode 207 and the voltage drop between the collector and emitter of the transistor 208. This voltage is negligible. Therefore, the voltage of the positive terminal voltage of the piezoelectric actuator 2 divided by the resistances 255 and 256 corresponds to the voltage between the positive and the negative terminals of the piezoelectric actuator 2. The divided voltage is compared with the comparison signal $V_R$ through the comparator 254, and if the divided voltage is higher than that of the comparison signal $V_R$, the output of the comparator 254 is "1" level (FIG. 14(H)) and the flip-flop 253 is reset. Thus, the output Q is "0" level and the transistor 208 is cut off (FIG. 14(D)). At that time, a considerable electric electric current has flowed through the coil 204 (FIG. 14(I)), and if the electric current is cut off abruptly, an abnormal high voltage is induced and the transistor 208 is destroyed. However, in this second embodiment, the coil 205 is coupled with the coil 204, and the energy stored in the coil 204 is returned to the power source through the coil 205.

The monostable multivibrator 257 is triggered at the falling edge of the output Q of the flip-flop 253, whereby the transistor 262 is made conductive, and the thyristor 206 is triggered through the pulse transformer 263 (FIG. 14(F)). The thyristor 206 is then conductive and the electric current induced across the coil 205 is restored to the battery 201 (FIG. 14(K)). Accordingly, the high voltage applied to the coil 205 is the product of the battery voltage and winding ratio between the coils 204 and 205, and thus the high voltage can be kept within the predetermined voltage rating. Moreover, since the energy can be returned to the battery, an advantage is obtained of a decrease in electric current consumption and heat diffusion.

When the drive signal falls, the monostable multivibrator 270 is triggered, the transistor 275 is made conductive, and the thyristor 212 is triggered through the pulse transformer 276 (FIG. 14(E)). When the thyristor 212 is conductive, the piezoelectric actuator 2, the coil 211, and the thyristor 212 constitute a series resonance circuit. Then, the charges on the piezoelectric actuator 2 are decreased (FIG. 14(G)) and the piezoelectric actuator 2 is contracted.

As explained above, the voltage applied to the piezoelectric actuator 2 can be arbitrarily controlled by the comparison signal $V_R$ and with a reliable response characteristic. The voltage changes the amount of expansion or contraction of the piezoelectric actuator 2, and thus the quantity of fuel injected by the fuel injection valve in FIG. 13 can be controlled. In addition, in this embodiment, when the load is driven by a coil having a small power loss, the generation of the high voltage which occurs when electric current is cut off during the term in which electric current flows to the coil, is prevented, since the energy is returned to the battery. Accordingly, the driving circuit of this embodiment has great advantages in that the power consumption is decreased and an apparatus using this circuit can be miniaturized and lighter in weight.

Although this embodiment is explained with reference to a fuel injection valve, the invention is not limited to this example. Namely, the invention can be utilized for controlling the load wherein the voltage applied to the capacitive-type load can be controlled with a reliable response characteristic and over a wide voltage range.

Figure 15:
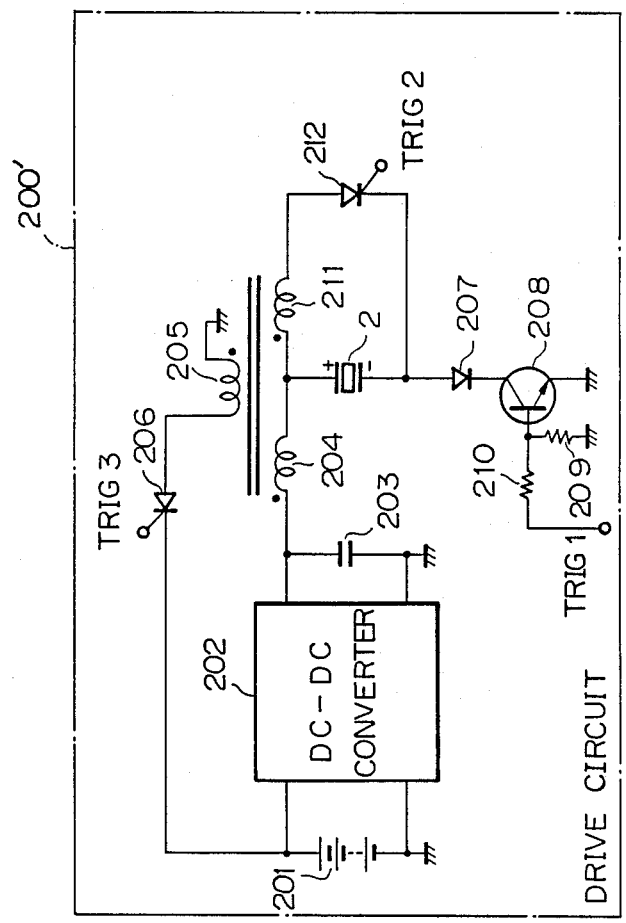
FIG. 15 and FIG. 16 are circuit diagrams showing modifications of the embodiment shown in FIGS. 10A and 10B.

A modification of the second embodiment is shown in FIG. 15. In this modification, the coils 204, 205, and 211 are wound on one core. Thus, the comparatively large size coils are made compact, and the apparatus using this modification can be miniaturized. If the polarity of each coil is as shown in FIG. 15, the function is the same as that of the coils in FIGS. 10A and 10B.

Figure 16:
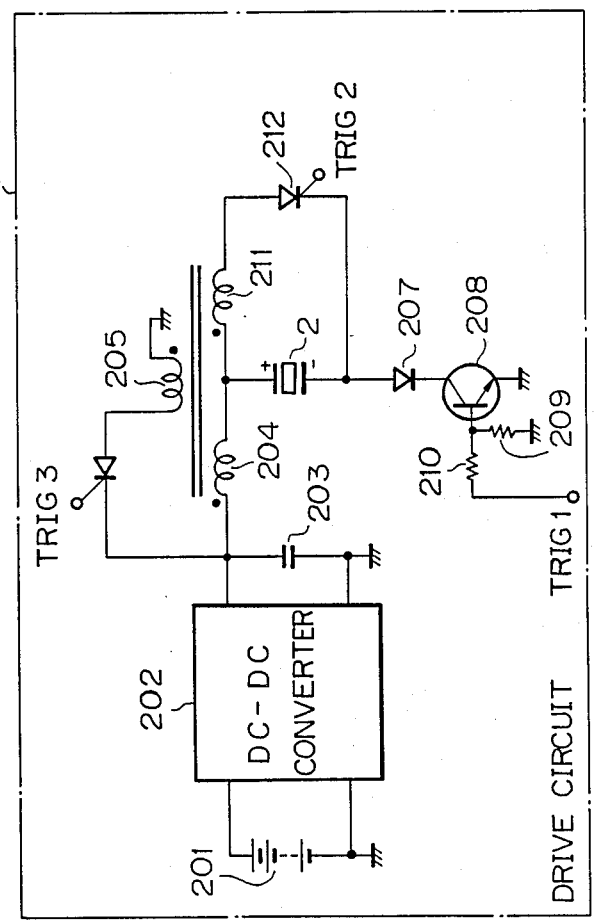

In addition, the energy returned from the coil 205 may be fed to the capacitor 203 storing the high voltage, as shown in FIG. 16, instead of to the battery 201. Accordingly, the energy restoration time can be reduced.

A third embodiment is shown in FIGS. 17A and 17B. In this embodiment, the cut off timing of the transistor 208 is controlled by the amount of charging, instead of by the terminal voltage, of the piezoelectric actuator. A resistance 401 is provided for detection of charge current, different from FIG. 10A. The voltage across the resistance 401 is integrated by a integration circuit comprising a resistance 291, an operational amplifier 292, and a capacitor 293. The integration value, i.e., the charging amount, is compared with a comparison voltage $V_R$ at a comparator 254. When the value becomes a predetermined value $V_R$, a flip-flop 253 is reset and a transistor 208 is cut off. An analog switch 294 discharges the capacitor 293 for integration. The output Q of the flip-flop 253 is applied to the analog switch 294 through an inverter 295, and when the output Q is "0", i.e., the transistor 208 is OFF, the analog switch 294 turns ON and the capacitor 293 is initialized. As mentioned above, when controlling the amount of charging grade, the relationship between the expansion and contraction of the piezoelectric actuator and the amount of charge or discharge has a better linearity and no hysteresis characteristic, and therefore, the controllability and accuracy of the fuel injection quantity is increased.

Figure 18B:
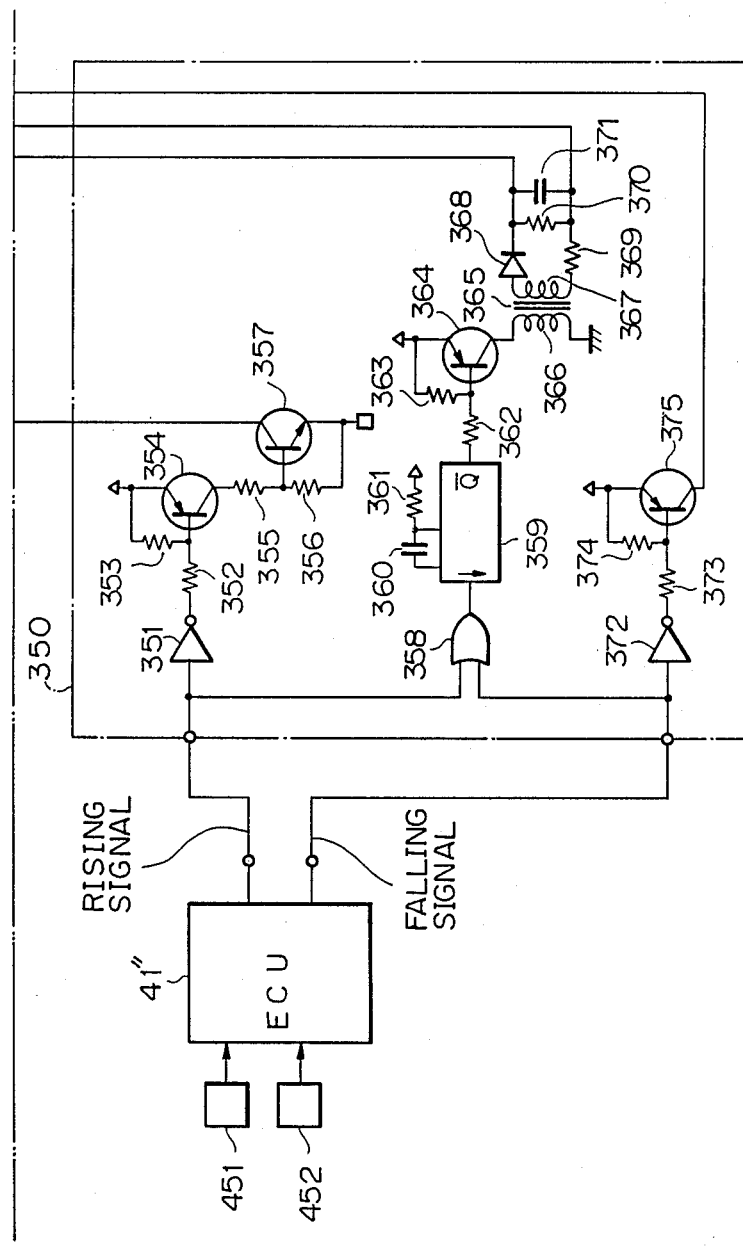

A fourth embodiment is explained below. FIGS. 18A and 18B are a circuit diagram showing a structure of a driving circuit for a piezoelectric actuator according to the fourth embodiment. The circuit in FIGS. 18A and 18B combines the stroke control at discharge in the first embodiment and the stroke control at charge in the second embodiment. This embodiment has the merits of both the first and the second embodiments.

An example of the driving circuit when applied to the pump type injector in the second embodiment is explained. The pump type injector in FIG. 13 pressurizes the fuel in the pump chamber 703 and injects the fuel from the injection nozzle 712. At that time, since the piezoelectric actuator 2 operates with very quick motion, e.g., 100 microseconds for expansion, the pump chamber 703 receives a shock pressure and an extremely large pressure pulsation is generated. Accordingly, problems arise wherein the pressure pulsation is felt in other portions or interacts in a complex manner, a secondary injection or higher degree injection occurs, and an adjustment accuracy of the fuel injection quantity is deteriorated. In addition, since upon contraction the piezoelectric actuator contracts at a similar high speed, the pressure pulsation of the pump chamber increases, boiling of the fuel caused by low pressure occurs, the fluctuation of the fuel supplement from check valve 705 increases, and a fluctuation of the remaining pressure in the pump chamber occurs. Thus, the problem of an unstable fuel injection quantity occurs, and therefore, the development of a method wherein the operation speed of the piezoelectric actuator can be controlled, is desired. In this fourth embodiment, the driving circuit has an advantage in that it can arbitrarily control the apparent response speed by performing the charge and discharge of the piezoelectric actuator at a high speed and intermittently.

In FIG. 18A, a drive circuit 300 comprises a battery 301, a DC-DC converter 302, and a capacitor 303 storing the high voltage generated by the DC-DC converter 302. One terminal of a first coil 304 is connected to the capacitor 303, and the other terminal is connected to the positive terminal of the piezoelectric actuator 2. A diode 305 prevents a reverse flow of the electric current through a transistor 306. The collector of the PNP type transistor 306 is connected to the anode of a diode 305, and the emitter of the transistor 306 is grounded. The base of the transistor 306 is supplied with a trigger 1 signal from a trigger generation circuit 350 through resistances 307 and 308.

The transistor 306, the diode 305, the capacitor 303, the first coil 304, and the piezoelectric actuator 2 constitute a series resonance circuit. A second coil 309 is wound on the core on which also the first coil is wound, and the polarities of the coil windings are as shown in FIG. 18A. One terminal of the second coil 309 is connected to the piezoelectric actuator 2 and the other terminal is connected to the anode of a diode 310. The collector of an NPN type transistor 311 is connected to the cathode of the diode 310 and the emitter of the transistor 311 is grounded. The diode 310 prevents a reverse flow of the electric current through the transistor 311. The base of the transistor 311 is connected to a trigger 2 signal from the trigger generation circuit 350 through resistances 312 and 313.

A third coil 314 is wound on the same core on which the first coil 304 and the second coil 309 are wound. The polarity of the coil winding is as shown in FIG. 18A. One terminal of the third coil 314 is grounded and the other terminal of the third coil is connected to the anode of a thyristor 315. The cathode of the thyristor 315 is connected to the positive terminal of the battery 301, and the gate of the thyristor 315 is connected to a trigger 3 signal from the trigger generation circuit 350.

The trigger generation circuit 350 is explained below. A rising signal and a falling signal are input to the trigger generation circuit 350 from an ECU 41", which will be later explained. The rising signal is supplied to an inverter 351 and the output of the inverter 351 is connected to the base of a transistor 354 through resistances 352 and 353. The emitter of the transistor 354, in connected, for example, to a +5 volt power source. The collector of the transistor 354 is connected to the base of a transistor 357 through resistances 355 and 356. The emitter of the transistor 357 is connected, for example, to a −5 volt power source. The output from the collector of the transistor 357 is the trigger 1 signal and drives the transistor 308. The rising signal is further supplied to a two input OR gate 358, and the output of the two input OR gate 358 is supplied to the falling edge trigger input of a monostable multivibrator 359.

The pulse width of the output of the monostable multivibrator 359 is determined by a capacitor 360 and a resistance 361. In this embodiment, the pulse width is approximately 30 microseconds, which is sufficient time to trigger the thyristor 315. The output $\overline{Q}$ of the monostable multivibrator 359 is connected to the base of a transistor 364 through resistances 362 and 363 and turns the same ON or OFF. Namely, the transistor 364 turns ON during 30 microseconds synchronously with the falling edge of the applied signal at the falling edge trigger input of the monostable multivibrator 359. The collector of the transistor 364 is connected to a primary winding 366 of a pulse transformer 365. The output from a secondary winding 367 of the pulse transformer 365 is the trigger 3 signal and is connected to the gate of the thyristor 315 through a diode 368 and a resistance 369. A resistance 370 and a capacitor 371 are used for noise prevention.

The falling signal is supplied to an inverter 372, and the output of the inverter 372 is supplied to the base of a transistor 375 through resistances 373 and 374. The emitter of the transistor 375 is connected, for example, to a +5 volt power source. The output from the collector of the transistor 375 is the trigger 2 signal and controls the transistor 311. The falling signal is supplied to the other input of the two input OR gate 358 and the trigger 3 signal is generated synchronously with the falling edge of the falling signal. The ECU 41" is the same as the ECU 41' in the second embodiment except that the output signals are the rising signal and the falling signal. The outputs from the air quantity sensor 451 and the water temperature sensor 452 are supplied to the ECU 41". The ECU 41" performs a predetermined operation and obtains a final driving frequency and a driving voltage. The explanation of this embodiment has been the same as that of the second embodiment. Subsequently, the ECU 41" outputs the rising signal having a pulse width, a pulse interval, and a pulse number in response to the driving voltage. After the generation of the rising signal ends, similarly, the ECU 41" outputs the falling signal having a pulse width, a pulse interval, and a pulse number in response to the driving voltage.

The operation of the fourth embodiment is now explained. FIG. 19 is a time chart showing signal waveforms for explaining the operation of this embodiment. When the rising signal (FIG. 19(A)) which is output from the ECU 41" is "1" level, the trigger 1 signal is −5 volts (FIG. 19(C)) and turns ON the transistor 306. Thus, the transistor 306, the diode 305, the capacitor 303, the first coil 304, and the piezoelectric actuator 2 constitute a series resonance circuit, and the high voltage stored in the capacitor 303 is applied to the piezoelectric actuator 2. At that time, a sinusoidal oscillatory current flows. Since the rising signal is made to return to "0" level after a time shorter than that of a half period of the sinusoidal current, the electric current through the first coil 304 is abruptly turned OFF (FIG. 19(F)).

In an ordinary case, since the electric current through the first coil 304 cannot be consumed, an abnormal high voltage is generated across the first coil 304 and this high voltage destroys the transistor 306. On the other hand, in this embodiment, when the rising signal is "0" level, the trigger 3 signal is generated from the monostable multivibrator 359 (FIG. 19(E)), and the thyristor 315 is made conductive. Since the first coil 304 is coupled to the third coil for power restoration, the stored energy in the first coil 304 is returned to the battery 301 (FIG. 19(H)) from the third coil 314 through the thyristor 315. After a predetermined time, the rising signal becomes "1" level again, the transistor 306 is made conductive, and the piezoelectric actuator 2 is again charged. Then, in the middle of the charging, the rising signal returns to "0" level, and the charging is interrupted. At that time, energy stored in the first coil 304 is returned to the battery 301. This return of energy is called restoration or regeneration. Subsequently, the restoration is repeated for a predetermined number of times, so that the charge of the piezoelectric actuator is performed gradually, and the charged voltage can rise slowly as shown in FIG. 19(I). Accordingly, the pressure in the pump chamber 703 in FIG. 13 rises comparatively slowly, the pulsation is suppressed, the secondary injection is eliminated, and the adjustment accuracy of the fuel injection quantity is increased.

The operation regarding the falling signal is similar to that of the rising signal. That is, when the falling signal is "1" level (FIG. 19(B)), the transistor 311 is made conductive. Thus, the piezoelectric actuator 2, the second coil 309, the diode 310, and the transistor 311 constitute a series resonance circuit for charging. As a result, a sinusoidal oscillatory current flows in this resonant loop. On the other hand, since the falling signal is returned to the "0" level at the time shorter than a half period of the sinusoidal current, the electric current flowing through the second coil 309 is abruptly turned OFF (FIG. 19(G)). However, the third coil 314 is coupled to the second coil 309, and therefore, energy stored in the second coil 309 is returned to the battery 301 through the third coil 314 and the thyristor 315, which is conductive at the falling edge of the falling signal (FIG. 19(H)).

After a predetermined time, the falling signal again becomes "1" level (FIG. 19(B)), the transistor 311 is made conductive, and again, the piezoelectric actuator 2 is discharged. If in the middle of the discharge, the falling signal is "0", the discharge is interrupted. At that time, energy stored in the second coil 309 is also returned to the battery 301. Subsequently, after repetition for the predetermined number of times, the discharge of the piezoelectric actuator 2 is performed gradually and the voltage thereacross falls slowly as shown in FIG. 19(I). As a result, the pressure in the pump chamber 703 of FIG. 13 falls comparatively slowly, the supplemental supply of the fuel from the check valve 705 is performed stably, the remaining pressure of the pump chamber 703 is equalized, the initial condition of the next injection is equalized, and a decrease in the fluctuation of the fuel injection quantity is obtained.

We claim:

1. A method for driving a capacitive-type load in an apparatus including a direct current power source; a capacitive-type load expanding and contracting when charged and discharged, respectively; a charging circuit having a first coil and a first switching element which are connected in series with said capacitive-type load from said direct current power source; a discharging circuit having a second coil and a second switching element which are connected in parallel with said capacitive-type load; a third coil electromagnetically coupled with at least one of said first coil and said second coil; and a third switching element provided in series with said third coil and said direct current power source; comprising the following steps of:

closing the switching element connected to the coil electromagnetically coupled with said third coil and flowing electric current therethrough to that coil;

opening the switching element closed by said closing step before the electric current flowing therethrough becomes zero; and closing said third switching element and restoring fly-back energy which is generated at the coil when the switching element is opened by said opening step, to said direct current power source through said third coil and said third switching element.

2. A method according to claim 1, wherein said third switching element is a semiconductor.

3. A method according to claim 1, wherein said direct current power source comprises a battery and a DC-DC converter which steps up low voltage of the battery to high voltage.

4. A method according to claim 3, wherein the fly-back energy from said third coil is restored to the low voltage side of the DC-DC converter.

5. A method according to claim 3, wherein the fly-back energy from said third coil is restored to the high voltage side of the DC-DC converter.

6. A method according to claim 1, wherein said switching element connected to the coil electromagnetically coupled with said third coil is opened at a timing determined by a time at which a voltage across said capacitive-type load reaches a predetermined voltage.

7. A method according to claim 1, wherein said switching element connected to the coil electromagnetically coupled with said third coil is opened at a timing determined by a time lapsed from a closing of said switching element.

8. A method according to claim 1, wherein said switching element connected to the coil coupled with said third coil is opened at a timing determined by a time at which a charging or discharging amount of said capacitive-type load reaches a predetermined value.

9. A method according to claim 1, wherein said switching element connected to the coil electromagnetically coupled with said third coil is repeatedly closed and opened.

10. A method according to claim 1, wherein said capacitive-type load is a piezoelectric actuator.

11. A method according to claim 1, wherein said capacitive-type load is an electrostrictive actuator.

12. An apparatus for driving a capacitive-type load comprising:
- a direct current power source;
- a capacitive-type load which expands and contracts when charged and discharged, respectively;
- a charging circuit connected in series with said power source and said capacitive-type load for charging said capacitive-type load by a direct current from said power source;
- a discharging circuit connected in parallel with said capacitive-type load for discharging same;
- at least one of said charging circuit and said discharging circuit including a primary coil and a switching element connected in series;
- an electric circuit connected to said switching element for controlling a turning ON and OFF of said switching element;
- a secondary coil electromagnetically coupled with said primary coil and connected to said power source for restoring to said power source fly-back energy generated when said switching element is turned OFF by said electric circuit.

13. An apparatus according to claim 12, wherein said capacitive-type load includes a piezoelectric actuator which controls an amount of fuel supplied to an internal combustion engine.

14. An apparatus according to claim 13, wherein said primary coil and said switching element are provided in said discharging circuit, and wherein said electric circuit includes:
- detection means for detecting a voltage across said piezoelectric actuator;
- comparison means for comparing the detected voltage with a predetermined reference; and
- control means for turning OFF said switching element in response to an output of said comparison means indicating that the detected voltage has reached a predetermined reference value.

15. An apparatus according to claim 13, wherein said primary coil and said switching element are provided in said charging circuit, and wherein said electric circuit includes:
- detection means for detecting a voltage across said piezoelectric actuator;
- comparison means for comparing the detected voltage with a predetermined reference; and
- control means for turning OFF said switching element in response to an output of said comparison means indicating that the detected voltage has reached a predetermined reference value.

* * * * *